(12) United States Patent
Tverdy et al.

(10) Patent No.: US 6,414,503 B1
(45) Date of Patent: Jul. 2, 2002

(54) MAGAZINE FOR CARRYING A PLURALITY OF MULTI-CHIP MODULES

(75) Inventors: Mark A Tverdy; William C. Layer; Lothar R. Kress, all of Boise; Eric M. Matthews, Nampa, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/726,084

(22) Filed: Nov. 29, 2000

Related U.S. Application Data (62) Division of application No. 09/065,799, filed on Apr. 23, 1998, now Pat. No. 6,229,323.

(51) Int. Cl.⁷ .............................................. G01R 31/02
(52) U.S. Cl. ...................... 324/758; 324/755; 324/158.1
(58) Field of Search .................. 324/755, 758, 324/158.1; 209/2, 571; 206/725, 724, 706, 714

(56) References Cited

U.S. PATENT DOCUMENTS

| | | | |
|---|---|---|---|
| 3,760,484 A | | 9/1973 | Kowalski |
| 4,448,306 A | * | 5/1984 | Sinnadurai et al. ......... 206/331 |
| 4,523,145 A | * | 6/1985 | Gray, Jr. .................... 324/758 |
| 5,103,976 A | * | 4/1992 | Murphy ...................... 206/328 |
| 5,117,963 A | | 6/1992 | Thayer et al. |
| 5,226,361 A | | 7/1993 | Grant et al. |
| 5,267,395 A | | 12/1993 | Jones, Jr. et al. |
| 5,307,011 A | | 4/1994 | Tani |
| 5,310,055 A | | 5/1994 | Chu |
| 5,313,156 A | | 5/1994 | Klug et al. |
| 5,510,724 A | | 4/1996 | Itoyama et al. |
| 5,596,282 A | | 1/1997 | Giddings et al. |
| 5,629,632 A | | 5/1997 | Tsutsumi |
| 5,667,077 A | | 9/1997 | Goins, III |
| 5,772,038 A | * | 6/1998 | Murata et al. .............. 206/725 |
| 5,848,703 A | * | 12/1998 | Murphy et al. ............. 206/725 |
| 5,857,573 A | * | 1/1999 | Pakeriasamy ............... 206/723 |
| 5,931,629 A | | 8/1999 | Rodier |
| 5,954,205 A | | 9/1999 | Smith |
| 5,988,394 A | * | 11/1999 | Emoto et al. ............... 206/724 |
| 6,031,384 A | | 2/2000 | Furuta |
| 6,079,565 A | * | 6/2000 | Walsh et al. ................ 206/725 |
| 6,202,883 B1 | * | 3/2001 | Narazaki et al. ........... 220/507 |
| 6,218,852 B1 | | 4/2001 | Smith |

OTHER PUBLICATIONS

Exatron Model 3000B SIMM/DIMM Memory Module Handler, Operation, Exatron, Inc., 1996–1997 (2 pages).

\* cited by examiner

*Primary Examiner*—Safet Metjahic
*Assistant Examiner*—T. R. Sundaram
(74) *Attorney, Agent, or Firm*—TraskBritt (57) ABSTRACT

A magazine for carrying a plurality of multi-chip modules (MCMs) in association with an automated MCM handler for automated module testing. The magazine includes a body defining a plurality of mutually parallel receptacles extending between two opposing body sides, each body side having a different height relative to the height of the receptacles. Each receptacle is separated from an adjacent receptacle by a baffle member. At least one notch ins formed in each baffle member so as to form at least one row of aligned notches extending across and contiguous with each receptacle. The aligned row of notches is configured to receive an elongated element for effectively altering the length of each receptacle. At least one recess is formed in an underside of the magazine and transversely intersects each receptacle. The magazine may also include structure to accommodate vertical stacking of the magazine with a plurality of like magazines.

11 Claims, 8 Drawing Sheets

MAGAZINE FOR CARRYING A PLURALITY OF MULTI-CHIP MODULES

CROSS-REFERENCE TO RELATED APPLICATION

This application is a divisional of application Serial No. 09/065,799, filed Apr. 23, 1998, now U.S. Pat. No. 6,229,323, issued May 8, 2001.

BACKGROUND OF THE INVENTION

1. Field of the Invention

The present invention relates to handling of multi-chip modules (MCMs) to facilitate automated testing and sorting thereof and, more specifically, to a magazine for carrying a plurality of MCMs in cooperative association with an automated module handler adaptable to handle different types and configurations of such modules.

2. State of the Art

Production and quality demands of the computer industry, and particularly the personal computer industry, have compelled automation of component testing with ever-higher throughputs. Individual semiconductor dice are at least subjected to a nominal level of testing and burn-in prior to being mounted on carrier substrates, such as printed circuit boards, and complete testing and characterization of dice to qualify what are termed "known good die" or "KGD" are becoming more prevalent, although by no means standard procedures. Over and above the testing of individual dice, however, is the requirement that a multi-chip module, comprising a carrier substrate, such as a circuit board bearing a plurality of dice thereon, be tested and characterized as an operational unit before being installed in a personal computer, either as original equipment or as part of an upgrade.

One particularly common type of multi-chip module is a multi-chip memory module, wherein a plurality of memory dice is mounted to one or both sides of a carrier substrate, which is then installed in a card slot in a personal computer chassis to provide or upgrade the memory capacity of the computer by connection of the module to the computer motherboard bearing the processor and logic circuits. The most common types of memory modules are currently Single In-line Memory Modules (SIMMs) and Dual In-line Memory Modules (DIMMs). Both SIMMs and DIMMs employ multiple pin edge connectors running along a single edge of the carrier substrate, the edge connectors providing electrical connections to the motherboard through the chassis of the computer. The edge connectors may include a single set of contacts extending about the edge, as in the case of a SIMM, or discrete contacts on each side of the carrier substrate adjacent the edge to provide more separate contact locations, as in the case of a DIMM.

As noted above, it is required that multi-chip modules, including without limitation memory modules, be tested prior to installation to ensure that they will be fully operational. Module handlers have been developed to automatically present modules to a testing device or "tester", which conducts the test of a module, the results of which test, in comparison to criteria preprogrammed in the tester, dictate the sort category of the module. The sort categories are conventionally either "pass" or "fail", although sorting into operational subcategories depending on variations in operational module performance is becoming more common. Handlers may include a hopper or tray into which a plurality of modules is preloaded before placement on the handler, which then feeds one module at a time to a test site for testing through the multiple pin edge connector of the carrier substrate and, subsequently, to a receptacle based upon the module's exhibited test characteristics.

Handlers, and specifically the module conveyance systems thereof, are ideally reconfigurable to accommodate different thicknesses of modules, the term "thickness" being used herein to denote the dimension of a module perpendicular to the plane of the carrier substrate, termed a "card" or "printed circuit board". Module thickness depends in part on carrier substrate thickness, in part on the height of the dice (including packaging) carried by the carrier substrate, and in part on whether dice are mounted to one or both sides of the carrier substrate. Many prior art handlers are only reconfigurable to accommodate different module thicknesses through extensive and complex removal and replacement of a substantial number of parts, which takes time and often requires the use of various tools.

One relatively simple approach to handler conveyance system reconfiguration is disclosed in U.S. Pat. No. 5,667,077, wherein an existing module handler conveyance channel is made reconfigurable to accommodate thicker or thinner modules through the insertion within the channel of one of a plurality of different-thickness, removable, justifying plates, the channel being sized to accommodate the thickest module contemplated for testing by the absence of any justifying plate whatsoever. The handler type to which the modifications are suggested, exemplified by the MC Systems, Inc. Model 828-MCM and Model 838-SIMM/DIMM Module Handlers, includes a vertical magazine or hopper which feeds modules to a belt-driven conveyance system employing the aforementioned variable-width channel to transport the modules in series to a test site and then to receptacles in a plurality of sort categories. Disadvantages of such an apparatus include the need for a large number of justifying plates if modules of a wide variety of thicknesses are to be tested, the practice of physical stacking of modules on top of one another (which may lead to damage), inability to ensure precise module alignment entering the conveyance system, lack of a positive grip on each module as it is conveyed to the test site (which may present alignment and jamming problems), lack of positive engagement and alignment of each module with the test contacts at the test site, and the lack of a positive and certain displacement of each tested module from the test site when it is to be moved toward the sort receptacles.

Another approach to module handlers is exhibited by the Exatron, Inc. Model 3000B SIMM/DIMM Handler, which employs gravity feed of singulated modules from a magazine along an inclined track to a test site, after which a tested module either slides directly into a bin of the appropriate sort category or into an output arm over a movable tray, the arm opening to release the module into a slot of the tray when aligned therewith. This handler is very operator time-intensive as it fails to provide a mechanism for receiving a large number of modules for test as it is limited to a single hand-loadable magazine of a set configuration fixed to a carriage on the handler, fails to provide positive retrieval of modules from the magazine and placement at the test site, fails to provide positive alignment of the modules at the test site, fails to provide positive displacement of a tested module from the test site, and does not appear to be quickly or easily adaptable to modules of varying thicknesses.

In short, conventional multi-chip module handlers suffer from insufficient automated input capacity, as well as a lack of positive module retrieval and placement at the test site, positive module alignment for test, and positive displacement of a tested module from the test site for sorting. Finally, the adaptability of conventional handlers to various types of modules is limited and cumbersome.

BRIEF SUMMARY OF THE INVENTION

In accordance with one aspect of the invention, a magazine is provided for carrying a plurality of multi-chip modules (MCMs) in cooperative association with an automated MCM handler. The magazine and automated handler may be cooperatively used in conjunction with any of a variety of testers.

The magazine includes a body having a row of mutually parallel receptacles formed therein. Each receptacle extends from a first body side to a second opposing body side. The first body side is defined to have a height relative to the plurality of receptacles, and the second body side is defined to have a height which is lesser than the height of the first body side relative to the plurality of receptacles. A plurality of baffle elements longitudinally extend between the first and second body sides and are positioned such that each of the baffle elements is located between two adjacent receptacles. A plurality of notches are formed in the baffles with at least one notch in each baffle element and contiguous with the two receptacles adjacent the baffle elements. The plurality of notches define an aligned row of notches positioned inwardly of the first and second body sides which extends across all of the receptacles.

The magazine may include additional features, such as, for example, a second row of aligned notches which extends across the plurality of receptacles; one or more recesses in the underside of the magazine which transversely intersect the plurality of receptacles; structure for engaging a drive for moving the magazine; or elements formed on the magazine for accommodating the stacking of a plurality of like magazines.

DETAILED DESCRIPTION OF THE INVENTION

Figure 1:
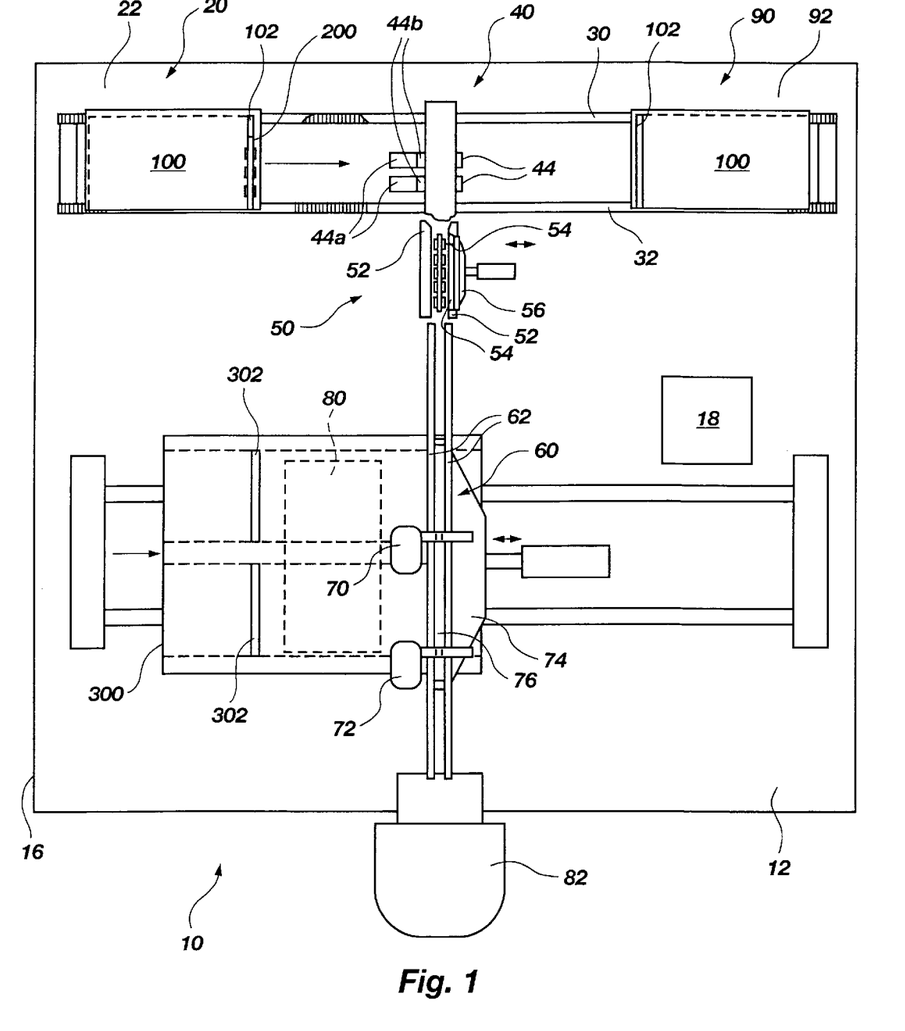
FIG. 1 comprises a schematic top elevation of an embodiment of the module handler of the present invention, the perspective being perpendicular to the incline of the front of the handler.
Figure 2:
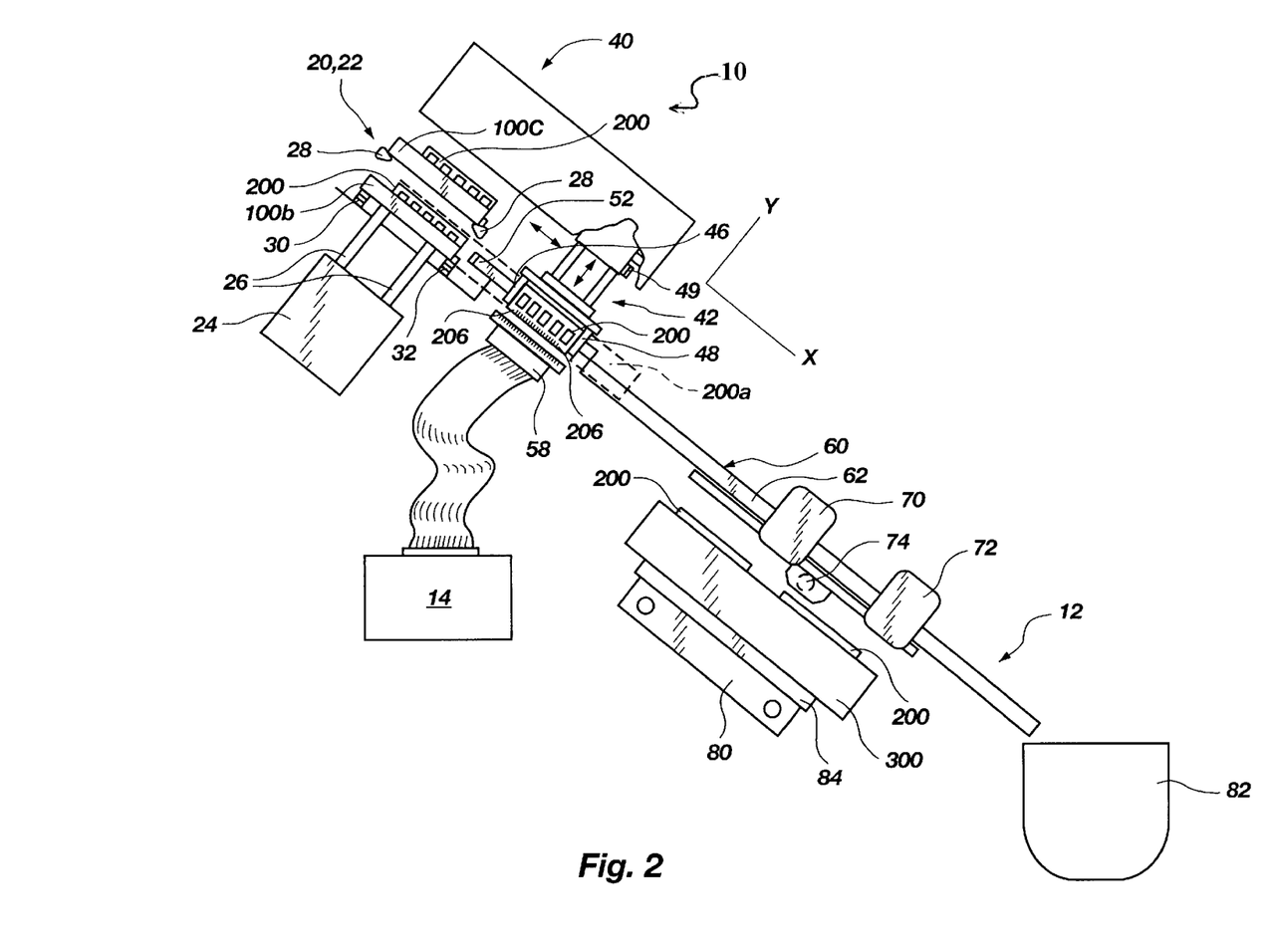
FIG. 2 comprises a schematic side elevation of the module handler embodiment of FIG. 1.

Referring now to FIGS. 1 and 2 of the invention, an embodiment 10 of the module handler of the present invention is schematically illustrated. As depicted in FIG. 2, the front face 12 of handler 10 is inclined at about a 35° angle to the horizontal to provide gravity assist to module movement. A tester 14 for testing the modules being processed by handler 10, which may comprise any one of a number of commercially offered testers, resides within the housing 16 of handler 10. One preferred tester usable with handler 10 is the Sigma 2 Tester offered by Darkhorse Systems, Inc. of Austin, Tex. The operation of handler 10 as to activation and sequencing of the various movable components and assemblies thereof, as well as initiation of the test sequence of tester 14, is controlled by a programmed controller 18, which may comprise any suitable commercially offered controller. One preferred controller is the Model 101-0092 Controller offered by Z World Engineering of Davis, Calif. As noted below, various sensors may also be employed to provide signals to controller 18 for initiation or cessation of activity of a particular component or assembly.

Figure 3:
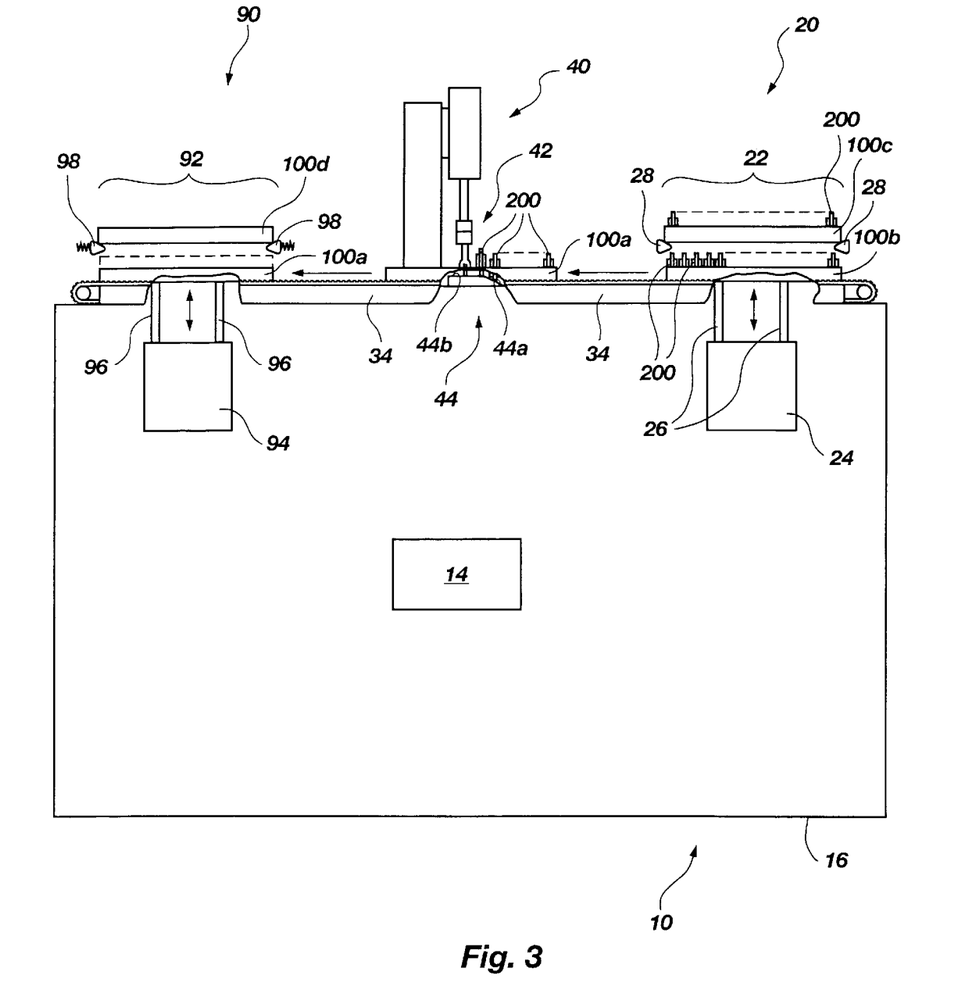
FIG. 3 comprises a schematic rear elevation of the module handler embodiment of FIG. 1.

Commencing at the top of handler 10, magazine input station 20 includes a magazine input zone 22 where a plurality of magazines 100 may be stacked. As can best be seen in FIG. 2, the magazine input stack (and also the output stack, as described later herein) is actually vertical or perpendicular with respect to the inclined front face 12 of handler 10 and not in the absolute sense, but will be described herein as being a "vertical" stack for the sake of convenience. Each magazine 100 of the input stack contains a plurality of multi-chip modules 200 such as, by way of example only, DIMMs or SIMMs, which are located in slots 102 in the magazines 100 and which are oriented in a mutually parallel relationship (see FIGS. 4 and 5). As seen in FIG. 3, input station 20 also includes an elevator 24 having upwardly projecting rams 26 located between drive belts 30 and 32 (FIG. 2) to lower the magazine stack as required when the former lowermost magazine 100a has moved horizontally out from under the stack so as to provide another full magazine 100b in the lowermost position. Input station 20 also includes a plurality (preferably four, spaced near each of the four corners of the input zone 22) of selectively extendable and retractable dogs 28 carried by a structure (not shown) extending above the front face 12 of handler 10 and located at an elevation to suspend a second-lowest magazine 100c in the input stack above the lowermost magazine 100b so that when elevator 24 has lowered magazine 100b completely, it may move horizontally from under the suspended magazine 100c.

Figure 4:
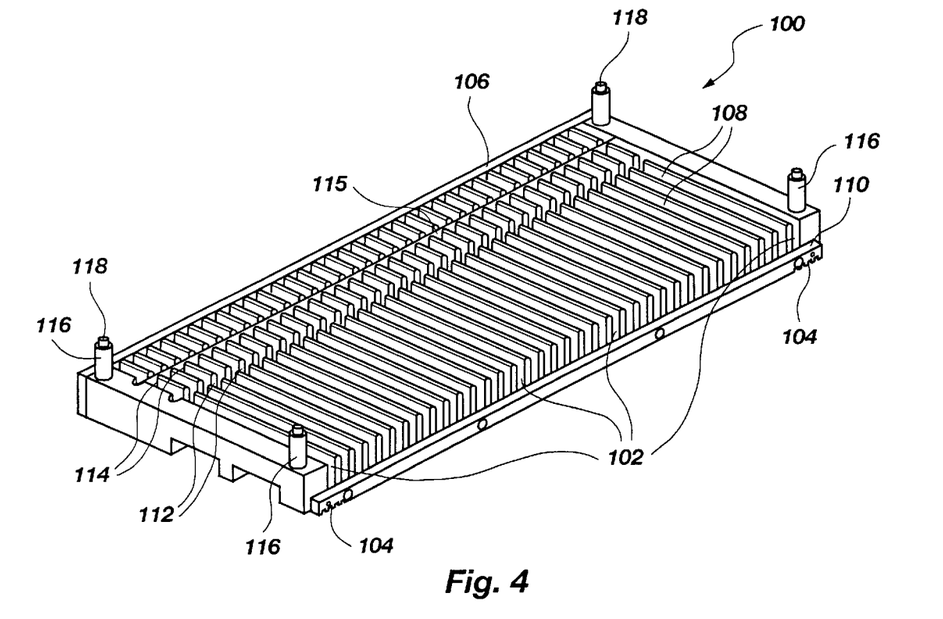
FIG. 4 comprises a top perspective view of a module magazine for the module handler of the present invention.
Figure 5:
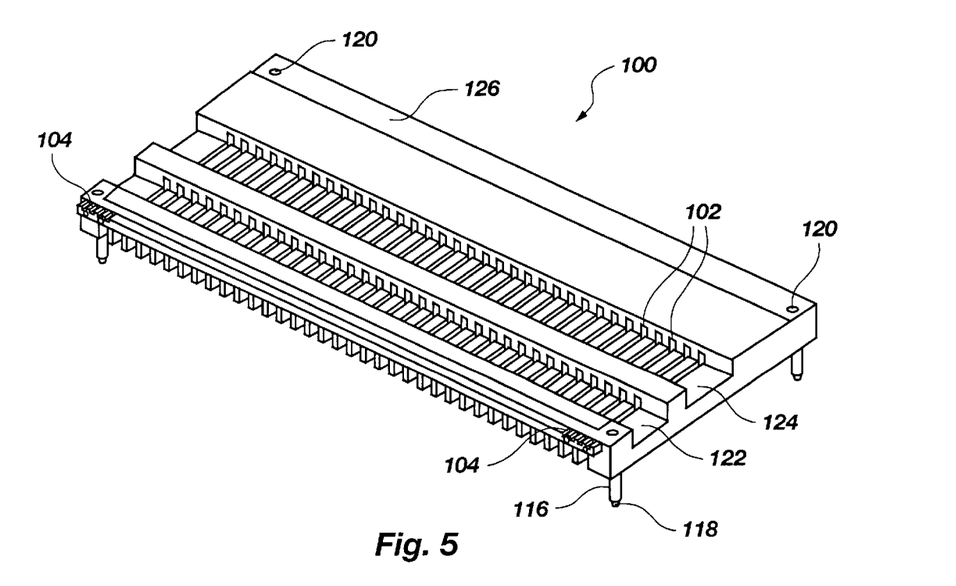
FIG. 5 comprises a bottom perspective view of the magazine of FIG. 4.

Magazines 100 are positively driven horizontally away from input station 20 and toward an indexing station 40 by two parallel, continuous, toothed drive belts 30 and 32, each sliding on underlying rails 34 extending between input station 20 and output station 90 for vertical support, belt 32 engaging cooperating teeth 104 of like pitch at each end of each magazine 100 (see FIGS. 4 and 5). It is also contemplated that smooth-surfaced drive belts may be employed, engagement with and movement of the magazines 100 being effected by friction alone, but such alternative is less preferred due to the potential for reduced precision in positioning the magazine 100.

Before proceeding further with a description of handler 10, it will be helpful to further describe magazine 100, which itself comprises part of the present invention, with reference to FIGS. 4 and 5. Each magazine 100 includes, as noted previously, a plurality of mutually parallel slots 102 oriented transversely to the length of the magazine 100 and its direction of travel through handler 10. One side 106 of magazine 100 is of a height substantially the same as the baffles 108 which define slots 102 therebetween, while the other, "open" side 110 is of a substantially lower height, providing only a small lip against which modules 200 rest when magazine 100 is tilted at a 35° angle to the horizontal on the front face 12 of handler 10 (see FIG. 2). Teeth 104 are located on the bottom of side 110 at each end of magazine 100. Baffles 108 are each notched at the same two locations 112 and 114 toward side 106 to provide, in combination, two longitudinally extending slots into which a metal, slat, bar or rod 115 may be inserted to shorten, if necessary, the effective length of each slot 102 to snugly accommodate modules 200 shorter than the total slot length and prevent shifting and possible damage to the modules 200 during handling of the magazine 100. Upwardly extending post-like elements 116 with protrusions 118 are located at each corner of magazine 100, and receptacles 120 are formed on the underside of each magazine 100 at locations to receive the protrusions 118 of another magazine 100 placed there underneath. The underside of each magazine 100 also includes two longitudinally-extending, mutually parallel recesses 122 and 124 which extend upwardly from the bottom of the magazine 100 a distance slightly larger than the height of side 110. Recesses 122 and 124 intersect slots 102, so that the carrier substrates of modules 200 loaded into slots 102 will extend into and across the recesses 122 and 124. Finally, the underside of magazine 100 may include a shallow, longitudinally extending recess 126 running along and under side 106 to assist magazine 100 in tracking on drive belt 30. Any suitable number of slots 102 may be employed in magazine 100 as sized and configured for use with input station 20 and output station 90, at appropriate spacing to accommodate adjacent modules 200 received therein without interference. As shown in FIG. 4, magazine 100 comprises a thirty-five slot magazine adapted to receive modules with dice on only one side of the carrier substrate, although twenty-five slot magazines of the same length are also preferred for relatively thicker modules such as those having dice on both sides of the carrier substrate.

Returning to FIGS. 1–3, as magazine 100a moves through indexing station 40, each module 200 is removed by indexing head 42 in cooperation with elevating ramps 44 (see FIGS. 1 and 3) as that module 200 is in vertical alignment with indexing head 42. Indexing head 42 is movable in the X- and Y- directions as shown in FIG. 2, and indexing fingers 46 and 48 are spaced to closely bracket the leading and trailing edges of a module 200 when indexing head 42 is moved downwardly thereover. As magazine 100a approaches indexing station 40, the bottom of each module 200 is contacted by inclined leading surfaces 44a of ramps 44 (see FIG. 3), the ramps 44 being aligned with recesses 122 and 124 of magazine 100a traveling thereover, each module 200 being gradually raised as it rides on ramps 44 as the magazine 100a travels toward indexing station 40 until that module 200 is resting on a horizontal upper surface 44b of the ramp 44 when aligned with the indexing head 42 at an elevation slightly above the height of a retaining lip provided by side 110 of the magazine 100a. At this point, indexing head 42 moves in the X-direction to test site 50, sliding and guiding module 200 therewith. It is also contemplated that elevating rams aligned with indexing station 40 might be employed in lieu of ramps 44 to raise each module for engagement and movement by the indexing head 42, but this alternative structure would add some cost and complexity to the handler 10, as well as requiring additional programming for controller 18.

Figure 6:
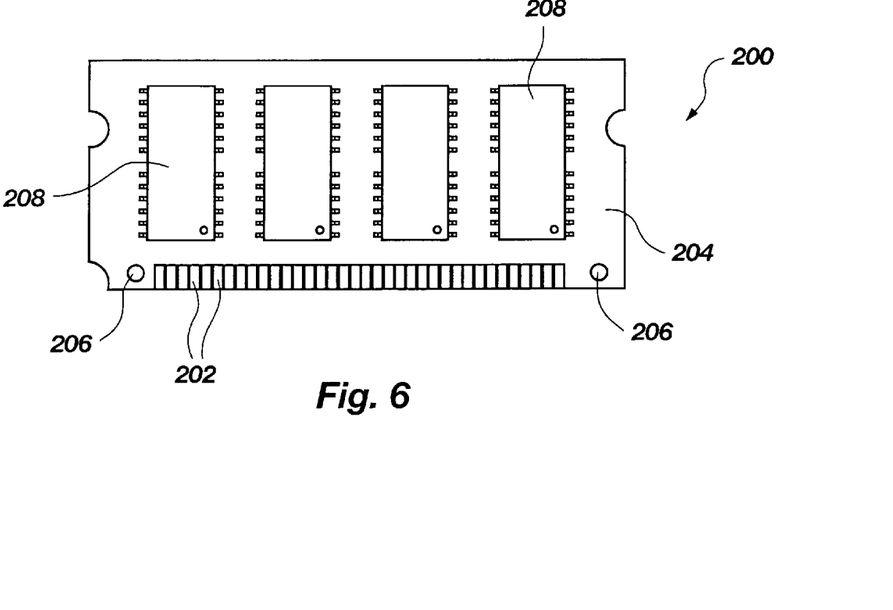
FIG. 6 is a top elevation of an exemplary multi-chip module in the form of a DIMM which may be handled by the magazine and module handler of the present invention.
Figure 9:
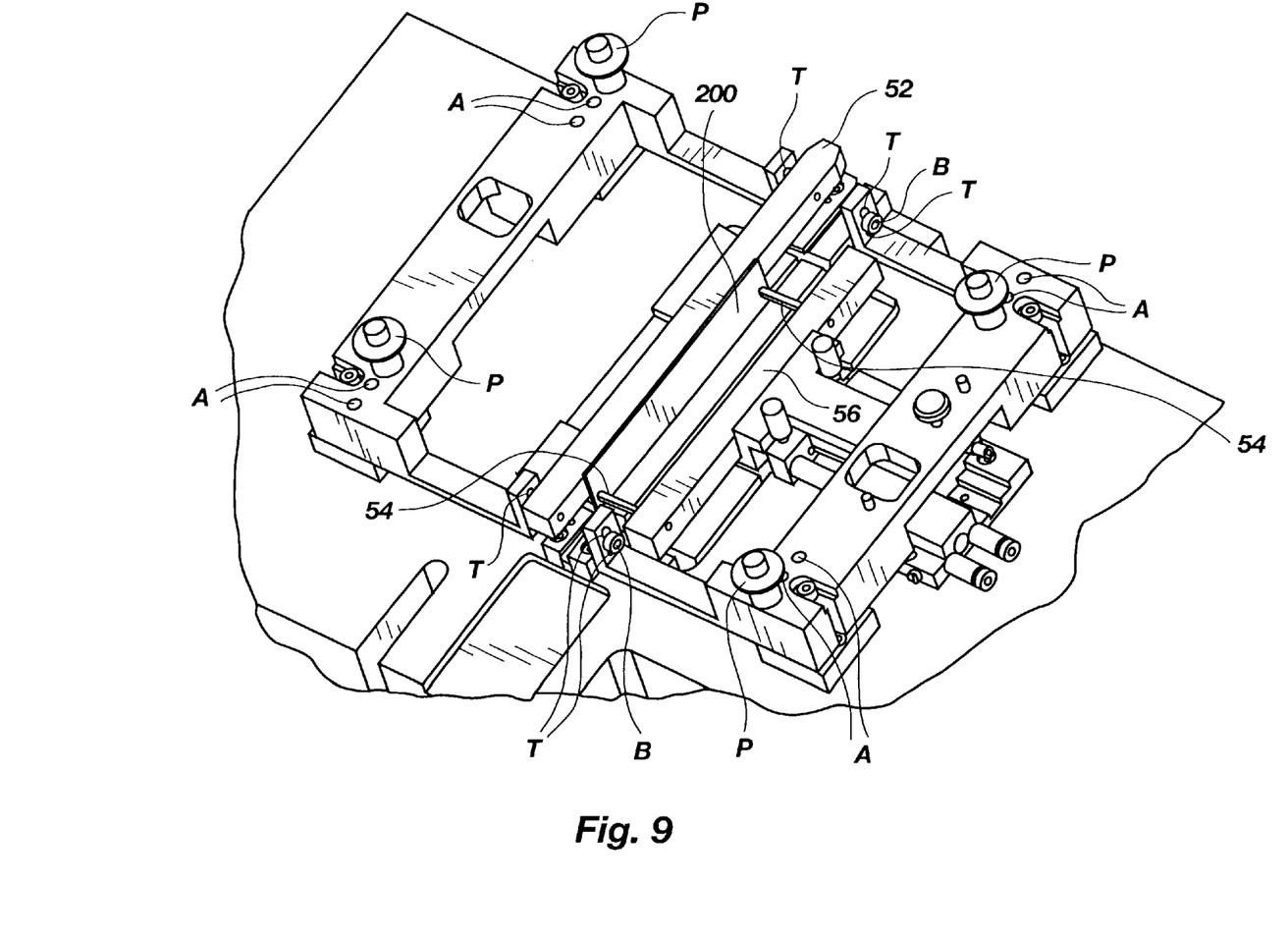

At test site 50, between test site guide rails 52 (see FIGS. 1 and 2) and while still constrained by indexing head 42, module 200, still in a vertical orientation as removed from magazine 100, is precisely aligned with respect to the test contacts which will engage the module's edge connectors 202 at the edge of carrier substrate 204 (see FIG. 6, wherein semiconductor memory dice 208 borne by carrier substrate 204 are also depicted) by insertion of locating pins 54 extendable transversely on carriage 56 (also termed a module locator bar) through tooling holes 206 in substrate 204. In FIGS. 1 and 9, right-hand guide rail 52 has been cut away for a better view of locating pins 54 and carriage 56 therebelow. Carriage 56 is replaceable by the operator to accommodate multiple module configurations having tooling holes 206 at different locations on the variously sized substrates. For example only, and not by way of limitation, carriage 56 may be changed out to accommodate a change from a 72-pin to 168-pin module handling. The unused or "spare" carriage or locator bar or bars 56 to accommodate different module configurations may be carried on the handler 10 at the test site.

After alignment, test contact clamps 58 (see FIG. 2) clamp test contacts to their target edge connectors 202, as known in the art, and indexing head 42 is withdrawn upwardly in the Y-direction and moved back over magazine 100a at indexing station 40 in the X-direction for retrieval of the next module 200, which is advanced for retrieval by movement of magazine 100a by drive belts 30 and 32. Tester 14 conducts a test of module 200 at the test site through test contact clamps 58 in accordance with the tester's programming and as known in the art.

When the next module 200 is advanced to test site 50 by indexing head 42, the tested module 200a at test site 50 has already been released and will normally slide downwardly along output track 60 between guide rails 62. However, if the tested module 200a has not moved from test site 50, indexing head 42 guiding the next module 200 from magazine 100 at indexing station 40 will positively eject the tested module 200a from test site 50, pushing it onto output track 60.

Figure 7:
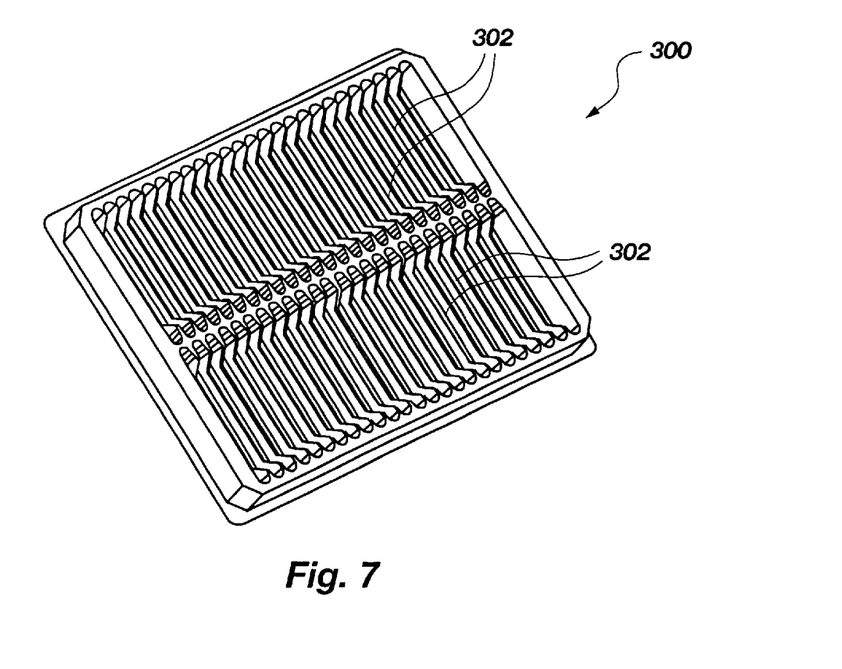
FIG. 7 is a perspective view of a shipping tray usable with the handler of the present invention.

If tested module 200a has passed the testing, it will be stopped at either upper stop 70 or lower stop 72, both of which are located above slide gate 74 which covers an aperture 76 in the bottom of output track 60. Upper stop 70 is located on output track 60 to stop a module 200 above a slot 302 of an upper row of slots 302 in a shipping tray 300 (see FIG. 7 for shipping tray details), while lower stop 72 is located to stop a module above a slot 302 of a lower row of slots 302 in the shipping tray 300, which is secured to a motor-driven carriage 80 movable on linear bearings transversely under output track 60 from left to right (as looking at FIG. 1). In operation, carriage 80 with an empty shipping tray 300 (see FIG. 7 for a detailed view of an exemplary shipping tray) is initially moved from a start position to the left of the output track 60 toward the right a distance so that the right-hand uppermost row tray slot 302 and lower row tray slot 302 are respectively aligned with upper and lower stops 70 and 72. When a tested, passed module 200 slides down output track 60, lower stop 72 is actuated to stop it above lower slot 302, whereupon slide gate 74 is retracted and module 200 drops a short distance into aligned lower tray slot 302. The next passed module 200 is stopped by upper stop 70 and dropped by retracted slide gate 74 into upper tray slot 302. Carriage 80 then advances to the right a distance equal to that between adjacent, parallel slot centers in the same slot row of shipping tray 300 to align the next set of empty upper and lower tray slots 302 with output track 60, and the sequence is repeated during module testing until shipping tray 300 is full. If a failed module 200 is released from the test site 50, neither stop 70 or 72 is actuated and the module 200 slides the length of output track 60 into discard bin 82 at the bottom thereof. As the shipping tray 300 is filled with passed modules 200, it moves progressively toward the right until it has passed completely under output track 60. When completely full, the shipping tray 300 is cycled back to the left on carriage 80 and removed therefrom, and an empty shipping tray 300 secured thereto. If different shipping trays are to be employed with carriage 80, changeable adapters 84 (see FIG. 2) boltable to carriage 80 may be employed to accommodate different trays.

Returning to the top of handler 10, when a magazine 100 such as magazine 100a has passed completely through indexing station 40, it continues its movement on drive belts 30 and 32 to output stack zone 92 of output station 90, wherein an elevator 94 having rams 96 and a set of four spring-loaded, extendable dogs 98 respectively operate to lift and then suspend an empty magazine 100 from drive belts 30 and 32 at a level higher than that of a magazine 100. Specifically, and with reference to FIG. 3, the previous empty magazine 100d, as shown, has been raised to a level immediately above spring-loaded dogs 98, which are located at an elevation higher than the height of magazines 100, so that magazine 100a may travel under magazine 100d to a position in vertical alignment therewith. Magazine 100a is then raised by rams 96 of elevator 94 extending between drive belts 30 and 32 to contact the underside of magazine 100d, which retracts spring-loaded dogs 98 by contact therewith as it moves upwardly, and the stack of magazines 100 is further raised by movement of magazine 100d until the output station dog locations are cleared by the underside of magazine 100a, at which point dogs 98 are again extended by their biasing springs in a "ratchet" effect and elevator rams 96 are lowered by elevator 94 so as not to interfere with the next magazine 100 arriving at output station 90 on drive belts 30 and 32. It will also be understood that powered, selectively extendable dogs as employed at the input station 20 might optionally be employed at output station 90. However, such an arrangement would, of necessity, add complexity and cost to handler 10 as well as require additional programming for controller 18.

Figure 8:
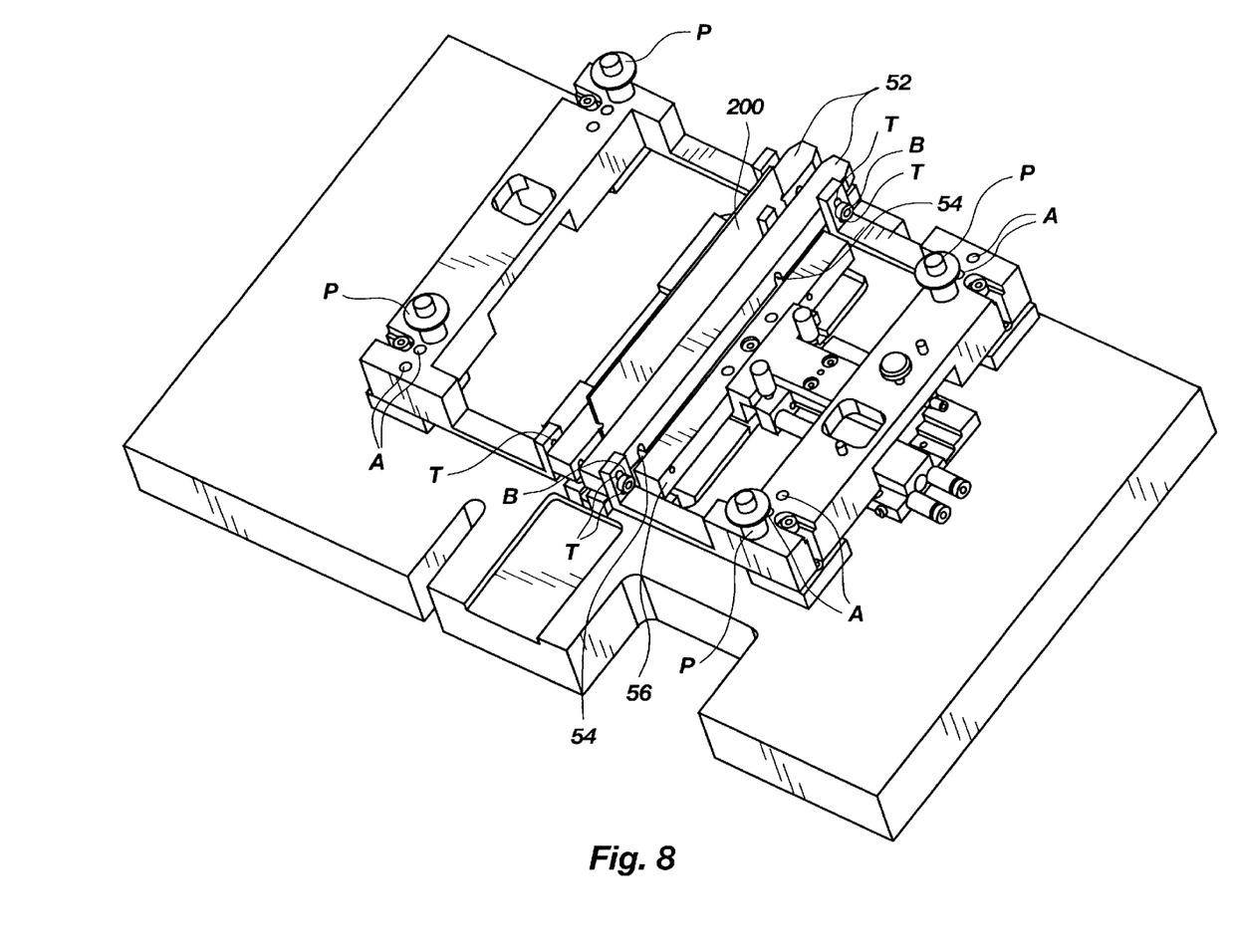
FIGS. 8 through 10 comprise detailed perspective views of some of the component assemblies of the handler of the present invention, illustrating the manner in which certain components may be relocated to accommodate modules of differing thicknesses.
Figure 10:
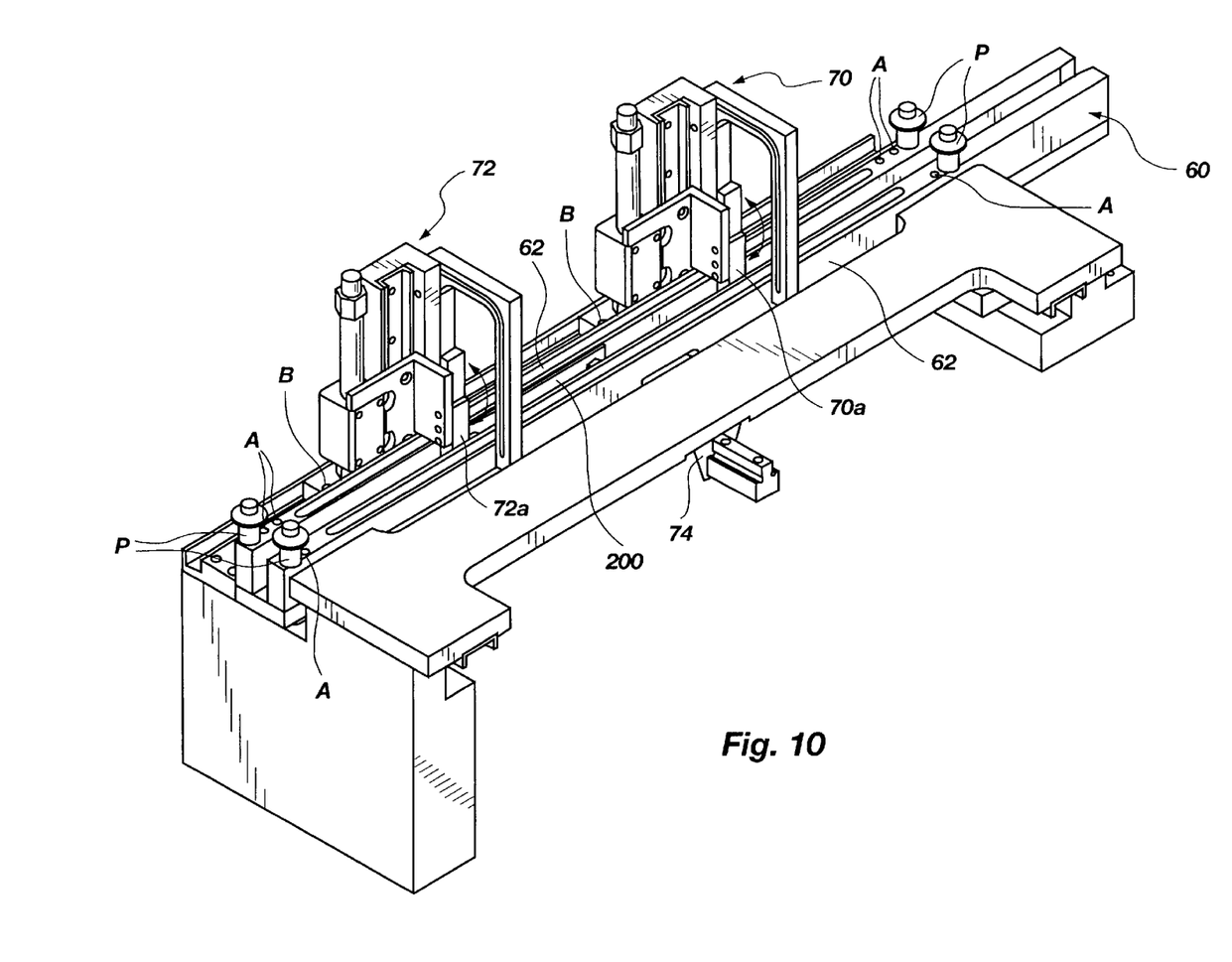

It should be noted at this time that the various components of handler 10 may be easily adjusted to accommodate different lengths, heights and thicknesses of modules 200 as required. For example, and with reference to FIGS. 8 through 10, wherein detailed views of various components and assemblies of handler 10 are depicted, quick release pins P are employed at various locations in conjunction with appropriately located receiving apertures A to position the components connected by the quick release pins P to underlying stationary components to accommodate various widths and heights of modules. In a similar manner, Allen head bolts B are employed with different threaded bores T to relocate other components, such as changing the height of test site guide rails 52. In a similar manner, the longitudinal location of upper and lower stops 70 and 72 along output track 60 to accommodate different shipping trays may be changed by loosening bolts B, sliding the associated stop up or down the track, and retightening the bolts B. Stop elements 70a and 72a of each respective stop 70 and 72 (see FIG. 10) include thicker and thinner ends to alternately project into output track 60, and are rotatably reversible (see arrows) to accommodate double or single-sided modules 200 (i.e., in terms of dice on both or only one side of the carrier substrate) in combination with output track guide rail 62 locational changes. Different sets of stop elements (each stop element being reversible as described) may be also used, for example, to precisely accommodate different dice heights, such as thin small outline package (TSOP) dice versus small outline j-lead (SOJ) dice. If used, the different sets of elements may be carried on handler 10 next to output track 60. While not illustrated in detail, indexing fingers 46 and 48 may be adjusted in height, and indexing finger 48 adjusted in longitudinal location on indexing head 42 using bolts B and in combination with different threaded bores T on indexing head 42, while stop block 49 is rotationally reversible to provide a different stop point when retrieving DIMMs versus SIMMs from a magazine 100 (see FIG. 2). For simplicity, components previously identified in conjunction with FIGS. 1–7 bear the same reference numerals in FIGS. 8–10.

It should also be noted that the drive systems of the various mechanisms described herein are conventional, and that electric, hydraulic and pneumatic drives may be interchanged as appropriate and dictated by suitability of each for a particular purpose. For example, indexing head 42 is preferably driven by two double-acting air (pneumatic) cylinders, one each for the X-and Y-directions. Similarly, carriage 56 bearing locating pins 54 is driven by a similar air cylinder, as are test contact clamps 58, as well as upper and lower stops 70 and 72, slide gate 74, elevators 24 and 94 and dogs 28 and 98. However, hydraulic or electric drives for these components, or any of them, may be substituted. Belts 30 and 32 are preferably driven by an electric rotary stepper motor or precise control of magazine advance through indexing station 40.

Finally, in order to confirm proper operational positioning of the various movable components of the handler 10 and of the modules 200 being handled for test and sort and avoid unnecessary cycling and jamming of handler 10, it is preferred that a number of sensors be placed at suitable locations. Depending on the parameter to be detected by a sensor, or control to be effected in response to the position of a component or module, proximity or through-beam sensors, or autoswitch sensors, all as know in the art, may be employed and signals therefrom communicated to controller 18 to trigger or halt a particular operational sequence of the handler 10. Such sensors and their use being well known in the art, and their placement being a matter of discretion by the designer as a function of the need to confirm various component and module positions, no further description thereof will be offered herein.

While the present invention has been described in the context of a certain preferred embodiment, those of ordinary skill in the art will understand and appreciate that it is not so limited. Specifically, additions, deletions and modifications to the invention as disclosed herein may be made without departing from the scope of the invention as defined by the claims hereinafter set forth.

What is claimed is:

1. A magazine for carrying a plurality of multi-chip modules (MCMs), comprising:

a body having a row of mutually parallel receptacles therein, each receptacle extending from a first body side to a second opposing body side, the first body side having a first height relative to the plurality of receptacles and the second body side having a second height relative to the plurality of receptacles, the first height being greater than the second height;

a plurality of baffle elements, each baffle element longitudinally extending between the first and second body sides and being positioned between two adjacent receptacles of the plurality of receptacles; and at least one notch formed in each baffle element and contiguous with each baffle element's adjacent receptacles, aligned to define a first row of notches positioned inwardly of the first and second body sides and extending across all of the receptacles.

2. The magazine of claim 1, further including an elongated element received in the first row of notches and extending transversely across and contiguous with all the receptacles.

3. The magazine of claim 2, further including a second notch in each baffle element between each receptacle and an adjacent receptacle, aligned to define a second row of notches positioned between the first body side and the first row of notches, the second row of notches extending across and contiguous with all of the receptacles.

4. The magazine of claim 1, further including structure on the magazine for engagement by a drive element for moving the magazine.

5. The magazine of claim 4, wherein the structure comprises teeth.

6. The magazine of claim 1, wherein the magazine is configured such that a maximum height of MCMs as disposed in the receptacles exceeds the height of the body, and wherein the magazine further includes elements on the body extending upwardly above the maximum height of MCMs as disposed in the receptacles.

7. The magazine of claim 6, wherein the elements include protrusions on an upper side of the body, and wherein an underside of the body includes a plurality of sockets sized and aligned with the protrusions and sized to receive a like set of protrusions therein.

8. The magazine of claim 1, wherein the receptacles comprise slots defined between the baffle elements, each slot longitudinally extending between the first body side and the second body side.

9. The magazine of claim 8, further comprising at least one recess in an underside of the body extending transversely to the plurality of slots, the at least one recess intersecting each slot.

10. The magazine of claim 9, wherein the at least one recess is of a height at least as great as the second height.

11. The magazine of claim 10, wherein the at least one recess comprises two mutually parallel recesses located between a closest row of notches to the second body side and the second body side.

* * * * *

UNITED STATES PATENT AND TRADEMARK OFFICE
CERTIFICATE OF CORRECTION

PATENT NO. : 6,414,503 B1
DATED : July 2, 2002
INVENTOR(S) : Mark A. Tverdy et al.

It is certified that error appears in the above-identified patent and that said Letters Patent is hereby corrected as shown below:

<u>Title page,</u>
Item [57], ABSTRACT,
Line 8, change "ins" to -- is --

<u>Column 8,</u>
Line 38, change "know" to -- known --
Lines 60, 62 and 67, change "plurality" to -- row --

<u>Column 9,</u>
Line 1, after "in" and before "each" insert -- said --
Line 2, after "with" and before "each" insert -- said --
Line 11, after "in" and before "each" insert -- said -- and after "between" and before "each" insert -- said --

<u>Column 10,</u>
Line 15, delete "plurality of"
Line 15, after "each" and before "slot" insert -- said --

Signed and Sealed this

Twenty-first Day of October, 2003

JAMES E. ROGAN
*Director of the United States Patent and Trademark Office*